United States Patent
Lee

(10) Patent No.: US 7,692,452 B2
(45) Date of Patent: Apr. 6, 2010

(54) SEMICONDUCTOR CHIP AND POWER GATING METHOD THEREOF

(75) Inventor: Hoi-Jin Lee, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 157 days.

(21) Appl. No.: 11/826,366

(22) Filed: Jul. 13, 2007

(65) Prior Publication Data
US 2008/0024205 A1 Jan. 31, 2008

(30) Foreign Application Priority Data
Jul. 14, 2006 (KR) .................... 10-2006-0066525

(51) Int. Cl.
*G11C 7/00* (2006.01)
(52) U.S. Cl. .................... 327/57; 327/218; 327/212
(58) Field of Classification Search ................ 327/543, 327/537; 307/52, 53, 80; 323/312
See application file for complete search history.

(56) References Cited

U.S. PATENT DOCUMENTS

| | | | | |
|---|---|---|---|---|
| 7,061,307 B2* | 6/2006 | Iroaga | ...................... | 327/541 |
| 7,071,771 B2* | 7/2006 | Takano et al. | ................ | 327/543 |
| 7,265,608 B1* | 9/2007 | Lu et al. | ...................... | 327/543 |
| 2005/0174099 A1* | 8/2005 | Ohkubo et al. | .............. | 323/315 |
| 2005/0270074 A1 | 12/2005 | Hardee | | |
| 2006/0181337 A1* | 8/2006 | Dreps et al. | ................ | 327/543 |

FOREIGN PATENT DOCUMENTS

| | | |
|---|---|---|
| JP | 2005-086805 | 3/2005 |
| KR | 10-1993-0011222 A | 6/1993 |
| KR | 1998-047093 | 9/1998 |
| KR | 10-2000-0041580 A | 7/2000 |
| KR | 10-2004-0019602 | 3/2004 |
| KR | 10-2004-0079840 | 9/2004 |

* cited by examiner

*Primary Examiner*—Lincoln Donovan
*Assistant Examiner*—Ryan C Jager
(74) *Attorney, Agent, or Firm*—Harness, Dickey & Pierce, P.L.C.

(57) ABSTRACT

A semiconductor chip may include an internal circuit, at least one power gating transistor, a system manager, and/or at least one current regulator. The at least one power gating transistor may be configured to switch a supply of at least one drive voltage into the internal circuit. The system manager may be configured to generate a control signal corresponding to an activation state of the internal circuit. At least one current regulator may be configured to control an amount of a current flowing through the at least one power gating transistor in response to the control signal.

21 Claims, 6 Drawing Sheets

SEMICONDUCTOR CHIP AND POWER GATING METHOD THEREOF

PRIORITY STATEMENT

This U.S. non-provisional patent application claims the benefit of priority under 35 U.S.C. §119 to Korean Patent Application No. 10-2006-0066525 filed on Jul. 14, 2006, the entire contents of which are incorporated herein in their entirety by reference.

BACKGROUND

1. Field

Example embodiments relate to semiconductor chips, and for example, to a semiconductor chip supplied with drive voltages by a power gating scheme.

2. Description of Related Art

Semiconductor chips are supplied with drive voltages by means of power gating schemes in order to reduce power leakage consumption. A time for stabilizing an operation after entering into a normal operation mode from a sleep mode in a semiconductor chip is called wake-up latency. In other words, wake-up latency means a time taken by each internal node of the semiconductor chip to arrive at a stable voltage, for example, a time for turning a gate-source voltage (VGS) of a power gating transistor into an operation voltage. The semiconductor chip does not begin any operation until each internal node reaches the stable voltage.

In a conventional semiconductor chip, a power gating operation is conducted to supply drive voltage into blocks by switching power gating transistors in the semiconductor chip. However, internal blocks of the semiconductor chip are different from each other in wake-up latency, e.g., a time for arriving at a stable voltage may differ between internal blocks. The internal blocks of the semiconductor chip have different wake-up latency because the internal blocks are different from each other in a current amount required for charging the stable voltage, but the same in current path, i.e., the same power gating transistor. For example, an internal block, which includes denser and more complicated logic circuits, e.g., arithmetic units, consumes more current than other internal blocks that are relatively less dense in circuit structure.

FIG. 1 shows an example graph illustrating a time gap among blocks of a semiconductor chip in arriving at a stable voltage. Referring to FIG. 1, a relatively less dense block represented by reference VDDmin operates in a shorter wake-up time (or latency) T1, while a relatively denser and more complicated block represented by reference VDDmax operates in a longer wake-up time T2. Because the semiconductor chip does not operate until all of internal circuit blocks are charged up to the stable voltage, a wake-up time of the semiconductor chip is dependent on the wake-up time T2 of the denser and more complicated block that arrives at the stable voltage in the longer time. For example, a conventional semiconductor chip has to wait until the internal block having the longest wake-up time reaches a stable voltage in order to set up a normal operating condition.

SUMMARY

Example embodiments may provide a semiconductor chip configured to operate with a power gating scheme enabling internal circuit blocks to be charged up to a stable voltage faster in a power-up mode.

According to an example embodiment, a semiconductor chip may include an internal circuit, at least one power gating transistor, a system manager, and/or at least one current regulator. The at least one power gating transistor may be configured to switch a supply of at least one drive voltage into the internal circuit. The system manager may be configured to generate a control signal corresponding to an activation state of the internal circuit. The at least one current regulator may be configured to control an amount of a current flowing through the at least one power gating transistor in response to the control signal.

According to an example embodiment, the at least one current regulator may be at least one current mirror connected to the at least one power gating transistor.

According to an example embodiment, the at least one current mirror may be a plurality of current mirrors connected to the at least one power gating transistor.

According to an example embodiment, the at least one power gating transistor may be a plurality of power gating transistors, and/or the plurality of current mirrors may each be connected to each of the plurality of power gating transistors.

According to an example embodiment, the at least one current regulator may include a plurality of switches configured to control the plurality of current mirrors, the plurality of switches being switched in response to the control signal.

According to an example embodiment, the control signal may be generated if the semiconductor chip enters a normal mode.

According to an example embodiment, the system manager may be configured to store activation information corresponding to the activation state of the internal circuit if the semiconductor chip enters a sleep mode.

According to an example embodiment, the at least one power gating transistor may be a PMOS transistor if configured to supply a power source voltage, and an NMOS transistor if configured to supply a ground voltage.

According to an example embodiment, each of the plurality of current mirrors may include a PMOS transistor, a current source, and/or a switch. The PMOS transistor may include a source connected to a drive voltage and a gate coupled to a gate of the at least one power gating transistor. The current source may be connected between a drain of the PMOS transistor and a ground. The switch connected between the drain and the gate of the PMOS transistor.

According to an example embodiment, the at least one current mirror may be a plurality of current mirrors, the at least one power gating transistor may be a plurality of power gating transistors, and/or each of the plurality of current mirrors may be connected to a corresponding at least one power gating transistor of the plurality of power gating transistors.

According to an example embodiment, the current regulator may include a plurality of switches configured to control the plurality of current mirrors, the plurality of switches being switched in response to the control signal.

According to an example embodiment, the control signal may be generated if the semiconductor chip enters a normal mode.

According to an example embodiment, the plurality of power gating transistors may be PMOS transistors if configured to supply a power source voltage, and NMOS transistors if configured to supply a ground voltage.

According to an example embodiment, the system manager may be configured to store activation information corresponding to the activation state of the internal circuit if the semiconductor chip enters a sleep mode.

According to an example embodiment, each of the plurality of current mirrors may include a PMOS transistor, a current source, and/or a switch. The PMOS transistor may include a source connected to a drive voltage and a gate coupled to a gate of the corresponding at least one power gating transistor of the plurality of power gating transistors. The current source may be connected between a drain of the PMOS transistor and a ground. The switch connected between the drain and the gate of the PMOS transistor.

According to an example embodiment, the at least one current regulator may be a plurality of current regulators, the at least one drive voltage may be a plurality of drive voltages, the at least one power gating transistor may be a plurality of power gating transistors, each of the plurality of power gating transistors being configured to switch a supply of one of the plurality of drive voltages into the internal circuit, and/or each of the plurality of current regulators may be configured to control an amount of current flowing through a corresponding at least one power gating transistor of the plurality of power gating transistors.

According to an example embodiment, the plurality of drive voltages may be supplied to a plurality of blocks of the internal circuit from the plurality of power gating transistors through a power line having a mesh structure.

According to an example embodiment, the system manager may be configured to generate the control signal corresponding to activation states of the plurality of blocks included in the internal circuit.

According to an example embodiment, the semiconductor chip may be a system-on-chip (SOC).

According to an example embodiment, a power gating method for supplying at least one drive voltage to a semiconductor chip may include storing information about activation blocks in the semiconductor chip. The semiconductor chip may be commanded to enter a normal mode. The at least one drive voltage may be supplied such that an amount of current flowing through at least one power gating transistor is controlled in accordance with the information about the activation blocks.

According to an example embodiment, the at least one drive voltage may be a plurality of drive voltages, the at one power gating transistor is a plurality of power gating transistors, and/or the plurality of drive voltages may be supplied such that amounts of currents flowing through the plurality of power gating transistors are controlled in accordance with the information about the activation blocks.

According to an example embodiment, the semiconductor chip may include a system manager for storing the information about the activation blocks.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
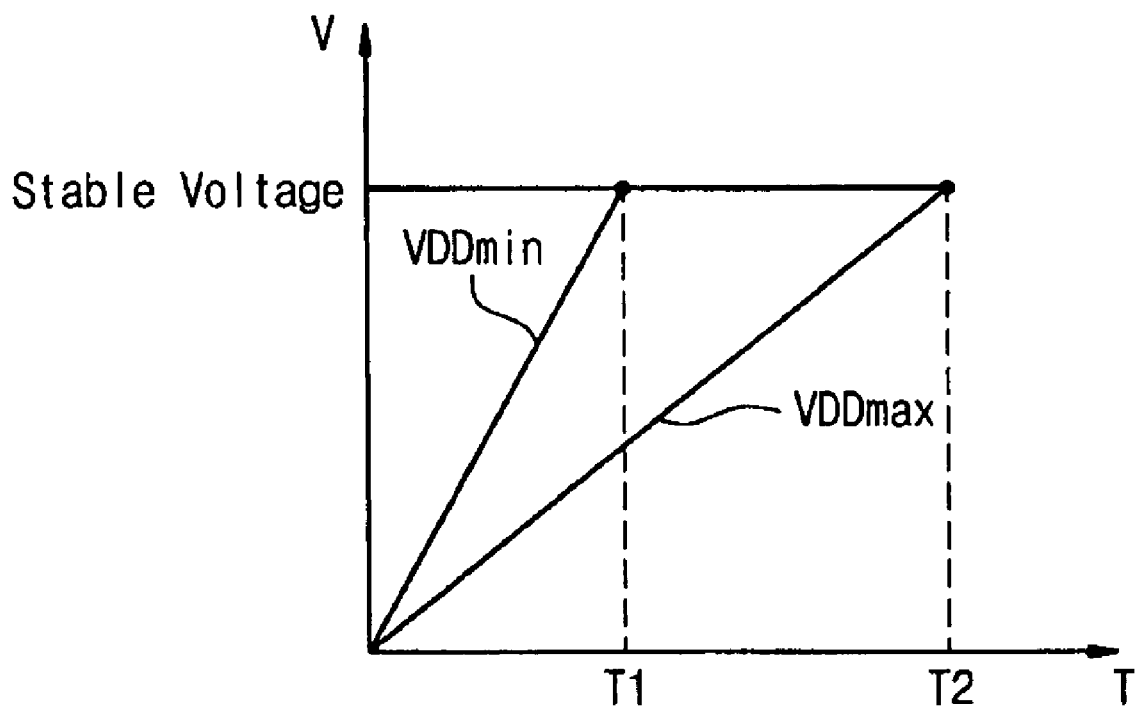
FIG. 1 shows an example graph illustrating a time gap among blocks of a conventional semiconductor chip in arriving to a stable voltage.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2:
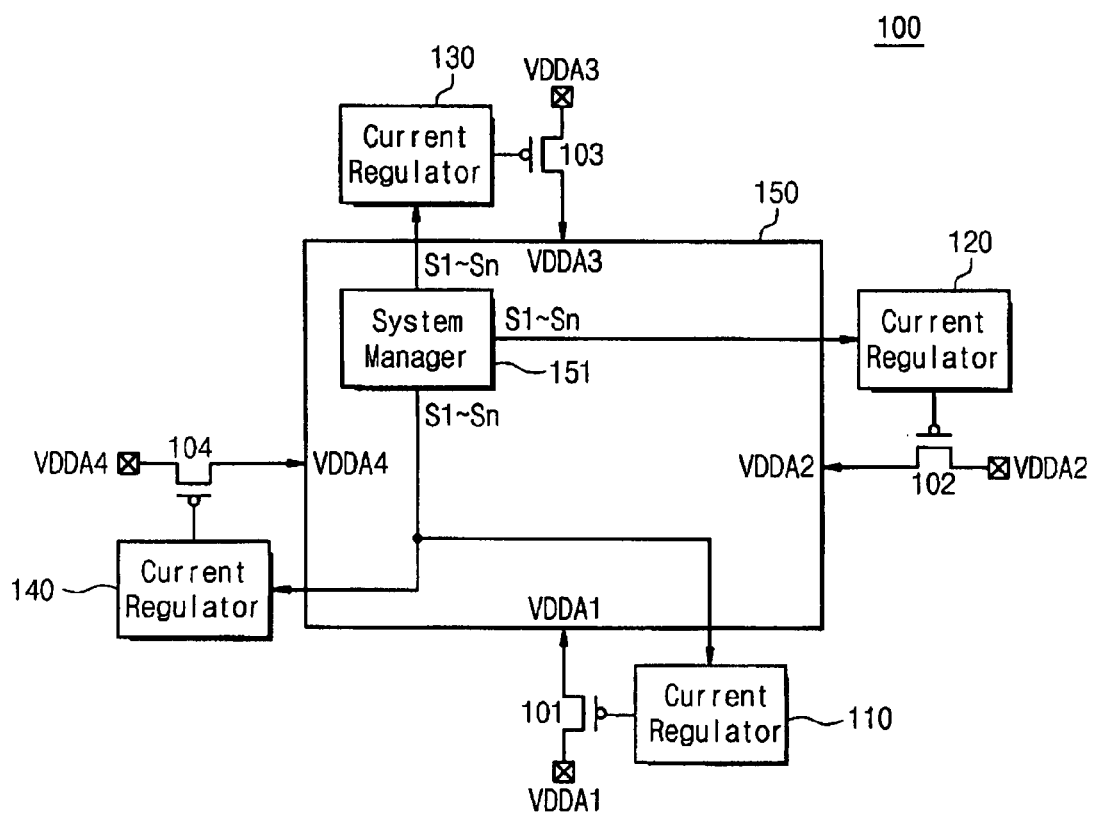
FIG. 2 illustrates a semiconductor chip supplying drive voltages by means of a power gating scheme according to an example embodiment.

FIG. 2 illustrates a semiconductor chip 100 supplying drive voltages using a power gating scheme according example embodiments. Referring to FIG. 2, the semiconductor chip 100 may include power gating transistors 101~104, current regulators 110~140, an internal circuit 150, and/or a system manager 151.

The semiconductor chip 100 may be a system-on-chip (SOC). A SOC may be independently drivable in a single chip, e.g., an independent chip embedding a system therein. Compared to a computer in which one chip may include only those hardware components necessary for processing commands, a SOC may include all supplemental electronic elements in addition to the hardware components necessary for processing commands. For example, a SOC intended for communication use may include a microprocessor, a digital signal processor (DSP), a random access memory (RAM), and/or a read-only memory (ROM). The SOC may contribute to scaling down a system in size and/or simplifying a fabrication process of the system.

The power gating transistors 101~104 may be used for supplying drive voltages VDDA1~VDDA4 to the internal circuit 150 by way of switching operations. Although FIG. 2 shows four drive voltages VDDA1~VDDA4 supplied to the internal circuit 150 by four power gating transistors 101~104 for convenience of description, example embodiments are not limited thereto, and more or less than 4 drive voltages may be supplied to the internal circuit 150 by more or less than 4 power gate transistors. The drive voltages VDDA1~VDDA4 may be supplied from external pads of the semiconductor chip 100.

The drive voltages VDDA1~VDDA4 may be supplied to the internal circuit 150 in units of blocks. For example, functional blocks may form power domains to be supplied with one of the drive voltages VDDA1~VDDA4. Although example embodiments are described as having the drive voltages VDDA1~VDDA4 supplied entirely into the internal block 150, example embodiments are not limited thereto and functional blocks may form power domains in the semiconductor chip 100 inside and/or outside the internal circuit 150 which are supplied with drive voltages. Although not shown, the internal circuit 150 according to an example embodiment may include power lines in a mesh structure. The drive voltages VDDA1~VDDA4 may be supplied in connection with the meshed power lines.

The current regulators 110~140 may be connected to gates of the power gating transistors 101~104. The current regulators 110~140 may control an amount of current flowing through the power gating transistors 101~104 in response to fixed control signals S1~Sn generated from the system manager 151. During a power-up or wake-up period, e.g., after entering into a normal mode from a sleep mode, the current regulators 110~140 may enable variable current flow conditions corresponding to an amount of current required for charging blocks of the internal circuit 150 to a stable current.

The system manager 151 may store information about activation states of the blocks of the internal circuit 150. The block activation information may be automatically stored in the system manager 151 if the semiconductor chip 100 enters into a sleep mode. During the wake-up period, the system manager 151 may generate the fixed control signals S1~Sn in accordance with the stored block activation information and/or transfer the fixed control signals S1~Sn corresponding to the block activation information to the current regulators 110~140.

Figure 3:
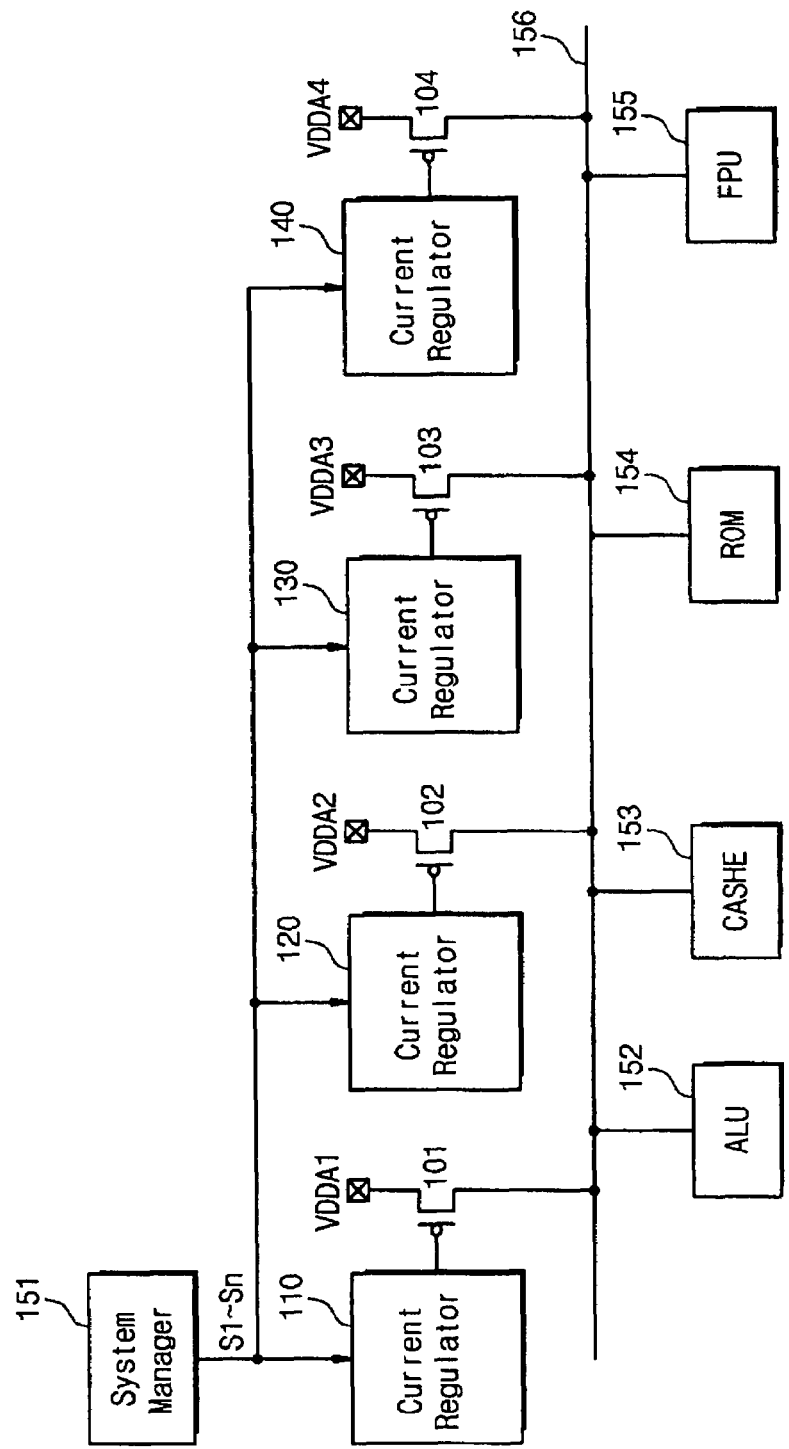
FIG. 3 shows a semiconductor chip supplying the drive voltages into internal circuit blocks by way of a power line.

FIG. 3 shows the semiconductor chip 100 supplying the drive voltages VDDA1~VDDA4 into blocks 152~155 of the internal circuit 150 by way of a power line 156. While the power line 156 may be formed of a mesh structure, FIG. 3 shows the power line 156 in a linear manner for convenience of description.

Referring to FIG. 3, the semiconductor chip 100 may include the blocks 152~155. The power gating transistors 101~104 may switch supply paths of the drive voltages VDDA1~VDDA4 for the blocks 152~155. For convenience of explanation, the blocks 152~155 are defined to be an arithmetic logic unit (ALU) 152, a cache 153, a ROM 154, and a floating-point processing unit (FPU) 155, respectively. However, example embodiments are not limited thereto, and the semiconductor chip 100 may include any number of blocks having any type of circuit configuration.

The blocks 152~155 may be different from each other in wake-up latency, e.g., the blocks, e.g., internal nodes included in the blocks, may arrive at a stable voltage in different periods of time. For example, the ALU 153 may include more complicated and/or denser circuitry. Therefore, the ALU 153 may arrive at the stable voltage after the cache 153 which may include less complicated and/or less dense circuitry because the ALU 152 may require more current than the cache 153 in arriving at the stable voltage. Accordingly, the semiconductor chip may not operate until the ALU 152 charges up to the stable voltage.

However, if the power gating scheme of the semiconductor chip 100 includes the current regulators 110~140, the current regulators 110~140 may enable a shorter wake-up latency for the semiconductor chip 100, e.g., the period of time for all of the blocks as a whole to reach the stable voltage may be reduced, by supplying more current into blocks that would otherwise have longer wake-up latencies. Accordingly, the wake-up latency of the semiconductor chip 100 may become shorter. The semiconductor chip 100 according to example embodiments may reach the stable voltage in a period of time corresponding to wake-up latencies of the less complicated and/or less dense blocks that may be charged up to the stable voltage in shorter periods of time, by properly modulating the current regulators 110~140.

The system manager 151 may generate the fixed control signals S1~Sn in accordance with an operation mode of the semiconductor chip 100, without using the block activation information of the internal circuit 150. For example, generating the fixed control signals S1~Sn without using the block activation information may provide more convenience in implementing the semiconductor chip 100. For example, the system manager 151 may generate and/or transfer different control signals S1~Sn to the current regulator 110 in accordance with various operating conditions of the semiconductor chip 100, e.g., a sleep mode, a stop mode, a normal mode, if the stop mode turns to the normal mode, if the normal mode turns to the sleep mode, and/or if the sleep mode turns to the normal mode.

However, a problem may arise from differences in conditions to be recovered during the wake-up period. For example, if the semiconductor chip 100 is loading data thereinto while entering the sleep mode, or while executing an adding operation, the semiconductor chip may require a longer time to wake up as compared to a time required by the semiconductor chip 100 to wake up from another sleep mode including different conditions. Accordingly, properly regulating a current amount using the stored block activation information of the internal circuit 150 during the wake-up period may be advantageous.

The power gating transistors 101~104 in the semiconductor chip 100 according to an example embodiment may be different from power gating transistors in a conventional semiconductor chip in a purpose of providing control for currents of the semiconductor chip. For example, the power gating transistors 101~104 may have larger drivability corresponding to various degrees of desired, or alternatively, predetermined current amount.

The power gating transistors 101~104 may be PMOS transistors if supplying a power source voltage or NMOS transistors if supplying a ground voltage.

Figure 4:
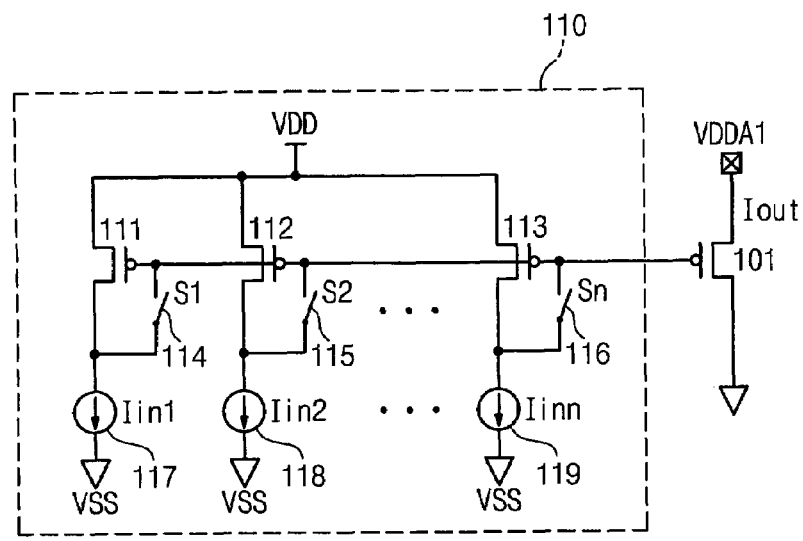
FIG. 4 illustrates a current regulator according to an example embodiment.

FIG. 4 illustrates the current regulator 110 according to an example embodiment. Referring to FIG. 4, the current regulator 110 may have a structure including a plurality of current mirrors, and/or may be connected to the power gating transistor 101.

The current regulator 110 may include PMOS transistors 111, 112, and/or 113, switches 114, 115, and/or 116, and/or current sources 117, 118, and/or 119.

The first PMOS transistor 111 may include a source connected to a power source voltage VDD, a drain connected to the first current source 117, and/or a gate coupled to a gate of the power gating transistor 101. The first switch 114 may be connected between the gate and the drain of the first PMOS transistor 111. The first current source 117 may be connected between the drain of the first PMOS transistor 111 and a ground VSS.

The first PMOS transistor 111, the first switch 114, the first current source 117, and/or the power gating transistor 101 may form a first current mirror. If the first switch 114 is turned on, a current $I_{out}$ flowing through the power gating transistor 101 from the first current mirror satisfies the following equation.

$$I_{out} = \frac{(W/L)_{out}}{(W/L)_{in1}} I_{in1} \quad (1)$$

In Equation 1, W is the channel width of a transistor, L is the channel length of a transistor, and the term $(W/L)_{out}$ represents drivability of the PMOS transistor 101 corresponding to the channel width and the channel length of the PMOS transistor 101. The term $(W/L)_{in1}$ represents drivability of the first PMOS transistor 111 corresponding to the channel width and the channel length of the first PMOS transistor 111.

The current regulator 110 according to an example embodiment may control the current $I_{in1}$ of the first current source 117 or vary the drivability of the PMOS transistor 111, e.g., $(W/L)_{in1}$, in order to regulate the current $I_{out}$ flowing through the power gating transistor 101. For example, the first switch 114 may be controlled by a portion of the fixed control signal S1~Sn, e.g., S1.

The second PMOS transistor 112 may include a source connected to a power source voltage VDD, a drain connected to the second current source 118, and/or a gate coupled to a gate of the power gating transistor 101. The second switch 115 may be connected between the gate and the drain of the second PMOS transistor 112. The second current source 118 may be connected between the drain of the second PMOS transistor 112 and the ground VSS.

The second PMOS transistor 112, the second switch 115, the second current source 118, and/or the power gating transistor 101 may form a second current mirror. If the second switch 115 is turned on, a current $I_{out}$ flowing through the power gating transistor from the second current mirror satisfies the following equation.

$$I_{out} = \frac{(W/L)_{out}}{(W/L)_{in2}} I_{in2} \quad (2)$$

In Equation 2, W is the channel width of a transistor, L is the channel length of a transistor, and the term $(W/L)_{out}$ represents drivability of the PMOS transistor 101 corresponding to the channel width and the channel length of the PMOS transistor 101. The term $(W/L)_{in2}$ represents drivability of the second PMOS transistor 112 corresponding to the channel width and the channel length of the second PMOS transistor 112.

The current regulator 110 according to an example embodiment may control the current $I_{in2}$ of the second current source 118 or vary the drivability of the second PMOS transistor 112, e.g., $(W/L)_{in2}$, in order to regulate the current $I_{out}$ flowing through the power gating transistor 101. For example, the second switch 115 may be controlled by a portion of the fixed control signal S1~Sn, e.g., S2.

The nth PMOS transistor 113 may include a source connected to a power source voltage VDD, a drain connected to the nth current source 119, and/or a gate coupled to a gate of the power gating transistor 101. The nth switch 116 may be connected between the gate and the drain of the nth PMOS transistor 113. The nth current source 119 may be connected between the drain of the nth PMOS transistor 113 and the ground VSS.

The nth PMOS transistor 113, the nth switch 116, the nth current source 119, and/or the power gating transistor 101 may form an nth current mirror. If the nth switch 116 is turned on, a current $I_{out}$ flowing through the power gating transistor from the nth current mirror satisfies the following equation.

$$I_{out} = \frac{(W/L)_{out}}{(W/L)_{inn}} I_{inn} \quad (3)$$

In Equation 3, W is the channel width of a transistor, L is the channel length of a transistor, and the term $(W/L)_{out}$ represents drivability of the PMOS transistor 101 corresponding to the channel width and the channel length of the PMOS transistor 101. The term $(W/L)_{inn}$ represents drivability of the nth PMOS transistor 113 corresponding to the channel width and the channel length of the nth PMOS transistor 113.

The current regulator 110 according to an example embodiment may control the current $I_{inn}$ of the nth current source 119 or vary the drivability of the PMOS transistor 113, e.g., $(W/L)_{inn}$, in order to regulate the current $I_{out}$ flowing through the power gating transistor 101. For example, the nth switch 114 may be controlled by a portion of the fixed control signal S1~Sn, e.g., Sn.

The current regulator 110 according to an example embodiment may include n current sources having the same or different drivability.

If the current regulator 110 according to another example embodiment includes identical n current sources 117-119 and/or the PMOS transistors 111~113 have a same drivability as each other, the drivability of the power gating transistor may be required to be at least three times the drivability of the PMOS transistors 111~113.

During a wake-up period, the current regulator 110 may operate as follows. The drive voltage VDDA1 may be supplied to the ALU 152 through the power gating transistor 101. For purposes of description two example cases for the ALU 152 are considered. A first example case is if the ALU 152 enters into a sleep mode without any operation, and a second example case is if the ALU 152 enters into a sleep mode during an adding operation. In the first example case, the system manager 151 may store activation information for the ALU 152 if the semiconductor chip 100 enters into a sleep mode. If the semiconductor chip 100 enters a normal mode from the sleep mode, the system manager 151 may generate and/or transfer the control signals S1~Sn corresponding to the activation information about the ALU 152 related to the first example case to the current regulator 110. The second example case of entering a sleep mode during an adding operation by the ALU 152 may require more current than the example first case of entering a sleep mode without any operation. Therefore, the system manager 151 may generate the control signals S1~Sn corresponding to the activation information related to the second example case in order to supply a larger current to the ALU 152.

The semiconductor chip 100 may reach the stable voltage and/or begins to conduct a normal operation. During the normal operation, the system manager 151 may maintain the levels of the control signals S1~Sn that have been transferred to the current regulator 110, or regenerate and/or transfer the control signals S1~Sn to the current regulator 110 for current supply in accordance with block activation of the internal circuit 151 for the normal operation.

The current regulator 110 according to an example embodiment may include a number n of current mirrors. The current regulator 110 may enable the current mirrors in response to the fixed control signals S1~Sn. Accordingly, the current $I_{out}$ may flow variably through the power gating transistor 101. An amount of current flowing through the power gating transistor may be determined by the system manager 151, depending on a block activation state of the internal circuit 150.

Figure 5:
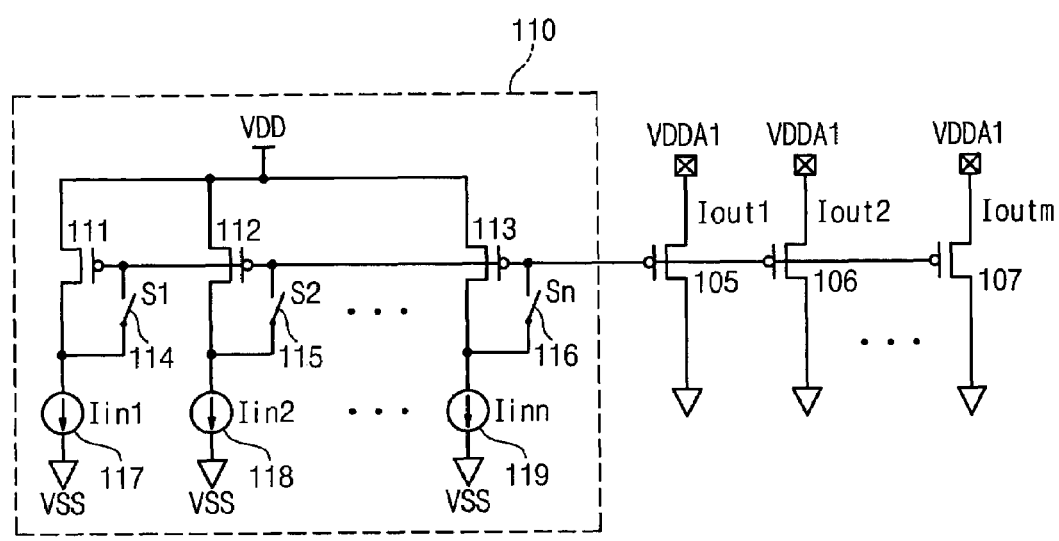
FIG. 5 illustrates a current regulator according to another example embodiment.

Referring to FIG. 5, the current regulator 110 according to another example embodiment may be shared by a plurality of power gating transistors for supplying the first drive voltage VDDA1 through the plurality of power gating transistors. The current regulator 110 may be connected to a number m of power gating transistors 105~107 which share the current regulator 110. For example, gates of each of the PMOS transistors 111~113 may be connected to gates of each of the power gating transistors 105~107. For example, the m power gating transistors 105~107 may each have the same current drivability. Accordingly, each of the power gating transistors 105~107 may have drivability greater than n/m times that of the current regulator 110.

The current regulator of FIG. 5 may be similar in operation as the current regulator of FIG. 4, and, therefore, a detailed description thereof is omitted.

Figure 6:
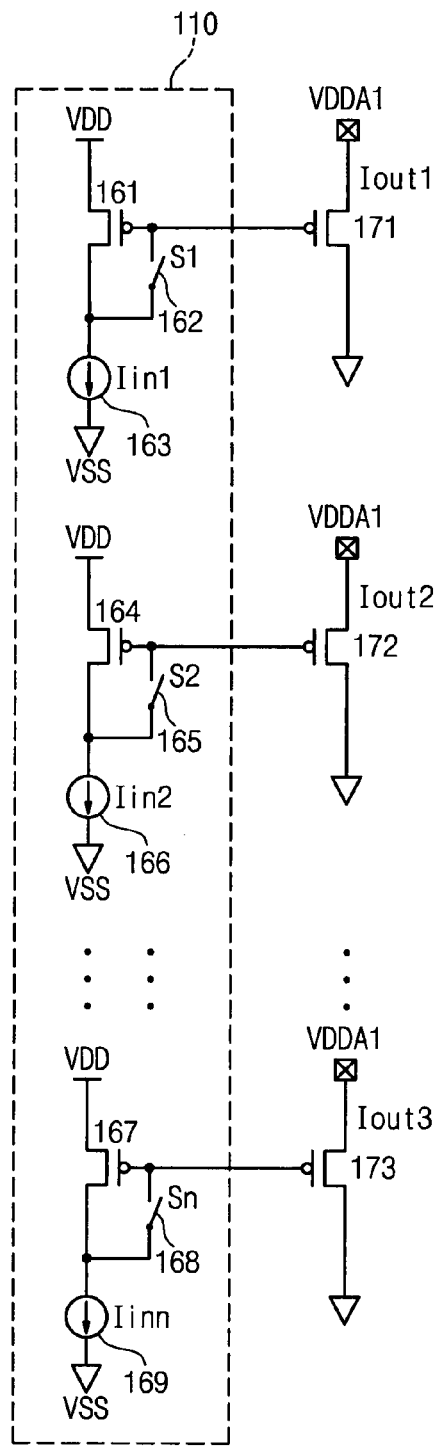
FIG. 6 illustrates a current regulator according to still another example embodiment.

FIG. 6 illustrates the current regulator 110 according to still another example embodiment. Referring to FIG. 6, the current regulator 110 may include a plurality of current mirrors connected to a plurality of power gating transistors 171~173. As illustrated in FIG. 6, there may be a number n of the current mirrors. For example, each of the current mirrors may include corresponding ones of PMOS transistors 161, 164, and 167, and current sources 163, 166, and 169 arranged between a power supply voltage VDD and a ground voltage VSS, and/or a corresponding switch of switches 162, 165, and 168 may be connected between a gate of the corresponding one of PMOS transistors 161, 164, and 167 and the corresponding one of current sources 163, 166, and 169 in each of the current mirrors. The current mirrors may turn the power gating transistors 171~173 on, respectively, in response to the control signals S1~Sn, controlling currents flowing through the power gating transistors 171~173.

The power gating transistors 101, and 105~107 shown in FIGS. 4 and 5 may be required to have larger drivability than the PMOS transistors 111-113 by at least three times n/m. However, PMOS transistors 161, 164, and 167 of FIG. 6, which are arranged correspondingly with the power gating transistors 171~173, may be designed to have the same drivability as the PMOS transistors 161, 164, and 167.

The current regulator of FIG. 6 may be similar in operation to the current regulator of FIG. 4, and, therefore, a detailed description thereof is omitted.

Although not shown, the current regulator according to example embodiments may control a current of the power gating transistor by applying a variable voltage thereto.

Figure 7:
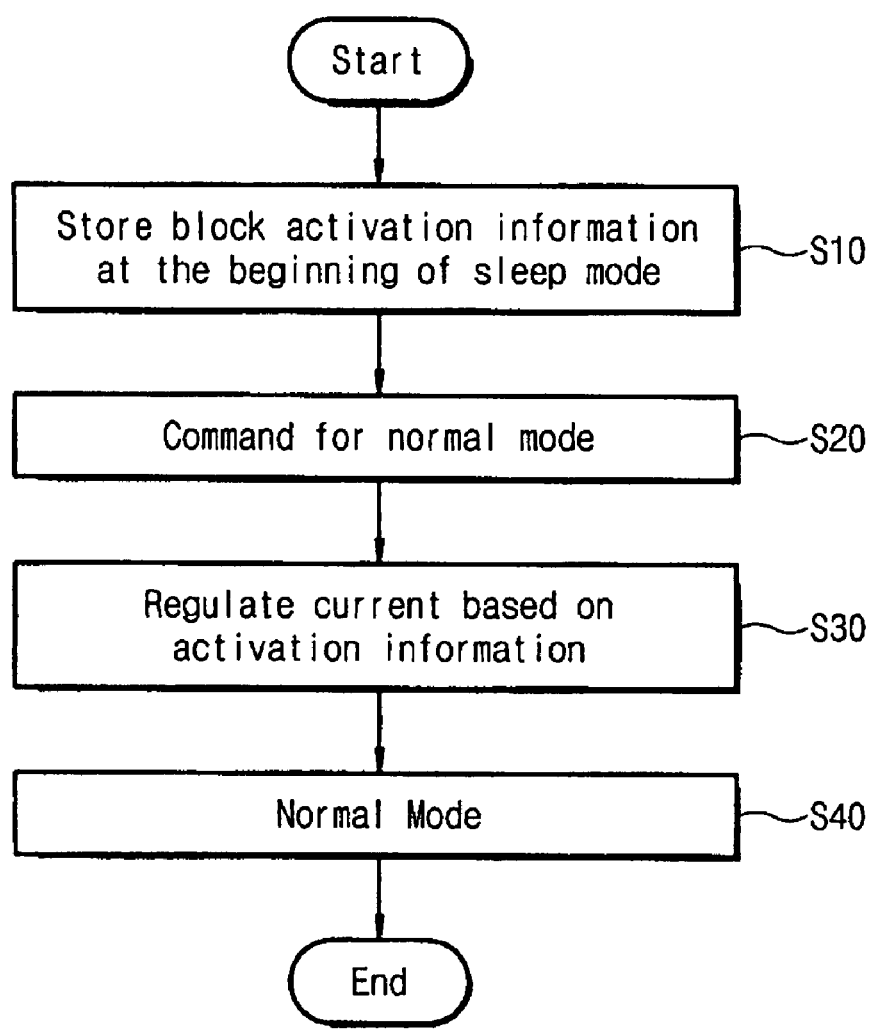
FIG. 7 shows a power gating procedure for a semiconductor chip according to an example embodiment.

FIG. 7 shows a power gating procedure for the semiconductor chip in accordance with an example embodiment.

In step S10, the system manager 151 may store information about an activation state of the internal block 150 if the semiconductor chip enters into a sleep mode.

In step S20, the semiconductor chip 100 in the sleep mode may accept a command for a normal mode. In the normal mode, the semiconductor chip 100 may be supplied with drive voltages by way of the power gating transistors.

In step S30, the system manager 151 may generate the control signals S1~Sn, according to the stored block activation information, and/or the current regulators 110~140 may each control current amounts of the power gating transistors 101~104 supplied into the internal circuit 150. The system manager 151 may provide the current regulators 110~140 with the control signals S1~Sn for enabling more current to flow into an internal circuit block (e.g., the ALU 152) that requires a larger amount of current in reaching the stable voltage. Accordingly, the semiconductor chip 100 as a whole may be charged up to the stable voltage in a shorter time.

In step S40, the semiconductor chip 100 may begin to conduct a normal operation at the stable voltage.

The semiconductor chip according to example embodiments may include current regulators for controlling amounts of currents flowing through the power gating transistors during a wake-up period. The current regulators may be designed to enable more current flow through an internal circuit block in which a driver voltage is more slowly charged up relative to others, causing the more slowly charging block to reach the stable voltage in a shorter time. Accordingly, the semiconductor chip according to example embodiments may be charged up to the stable voltage faster.

The system manager 151 according to an example embodiment may generate control signals for detecting voltages from nodes of the internal circuit blocks in real time.

As described above, a semiconductor chip according to example embodiments may include current regulators. The current regulators may enable the semiconductor chip as a whole to be charged up to the stable voltage faster by controlling currents of the power gating transistors during a wake-up or power-up period.

Although example embodiments have been shown and described in this specification and figures, it would be appreciated by those skilled in the art that changes may be made to the illustrated and/or described example embodiments without departing from their principles and spirit.

What is claimed is:

1. A semiconductor chip comprising:
an internal circuit;
at least one power gating transistor configured to switch a supply of at least one drive voltage into the internal circuit;
a system manager configured to generate a control signal in accordance with an activation state of the internal circuit; and
at least one current regulator configured to control an amount of a current flowing through the at least one power gating transistor in response to the control signal, wherein
the at least one current regulator is a plurality of current regulators,
the at least one drive voltage is a plurality of drive voltages,
the at least one power gating transistor is a plurality of power gating transistors, each of the plurality of power gating transistors being configured to switch a supply of one of the plurality of drive voltages into the internal circuit, and
each of the plurality of current regulators is configured to control an amount of current flowing through a corresponding at least one power gating transistor of the plurality of power gating transistors.

2. The semiconductor chip as set forth in claim 1, wherein at least one of the plurality of current regulators is at least one current mirror connected to at least one of the plurality of power grating transistors.

3. The semiconductor chip as set forth in claim 2, wherein the at least one current mirror is a plurality of current mirrors connected to the at least one of the plurality of power gating transistors.

4. The semiconductor chip as set forth in claim 3, wherein the plurality of current mirrors are each connected to each of the plurality of power gating transistors.

5. The semiconductor chip as set forth in claim 3, wherein the at least one of the plurality of current regulators includes a plurality of switches configured to control the plurality of current mirrors, the plurality of switches being switched in response to the control signal.

6. The semiconductor chip as set forth in claim 5, wherein the control signal is generated if the semiconductor chip enters a normal mode.

7. The semiconductor chip as set forth in claim 6, wherein the system manager is configured to store activation information corresponding to the activation state of the internal circuit if the semiconductor chip enters a sleep mode.

8. The semiconductor chip as set forth in claim 5, wherein the at least one of the plurality of power gating transistors is a PMOS transistor if configured to supply a power source voltage, and an NMOS transistor if configured to supply a ground voltage.

9. The semiconductor chip as set forth in claim 3, wherein each of the plurality of current mirrors includes,
a PMOS transistor, the PMOS transistor including a source connected to a power source voltage and a gate coupled to a gate of the at least one power gating transistor;
a current source, the current source connected between a drain of the PMOS transistor and a ground; and
a switch, the switch connected between the drain and the gate of the PMOS transistor.

10. The semiconductor chip as set forth in claim 2, wherein the at least one current mirror is a plurality of current mirrors, each of the plurality of current mirrors is connected to a corresponding at least one of the plurality of power gating transistors.

11. The semiconductor chip as set forth in claim 10, wherein the current regulator includes a plurality of switches configured to control the plurality of current mirrors, the plurality of switches being switched in response to the control signal.

12. The semiconductor chip as set forth in claim 11, wherein the control signal is generated if the semiconductor chip enters a normal mode.

13. The semiconductor chip as set forth in claim 12, wherein the plurality of power gating transistors are PMOS transistors if configured to supply a power source voltage, and NMOS transistors if configured to supply a ground voltage.

14. The semiconductor chip as set forth in claim 13, wherein the system manager is configured to store activation information corresponding to the activation state of the internal circuit if the semiconductor chip enters a sleep mode.

15. The semiconductor chip as set forth in claim 10, wherein each of the plurality of current mirrors includes,
a PMOS transistor, the PMOS transistor including a source connected to a power source voltage and a gate coupled to a gate of the corresponding at least one power gating transistor of the plurality of power gating transistors;
a current source connected between a drain of the PMOS transistor and a ground; and
a switch connected between the drain and the gate of the PMOS transistor.

16. The semiconductor chip as set forth in claim 1, wherein the plurality of drive voltages are supplied to a plurality of blocks of the internal circuit from the plurality of power gating transistors through a power line having a mesh structure.

17. The semiconductor chip as set forth in claim 16, wherein the system manager is configured to generate the control signal corresponding to activation states of the plurality of blocks included in the internal circuit.

18. The semiconductor chip as set forth in claim 1, wherein the semiconductor chip is a system-on-chip (SOC).

19. A power gating method for supplying at least one drive voltage to a semiconductor chip, the method comprising:
storing information about activation blocks in the semiconductor chip;
commanding the semiconductor chip to enter a normal mode; and
supplying the at least one drive voltage such that an amount of current flowing through at least one power gating transistor is controlled in accordance with the information about the activation blocks, wherein
the at least one drive voltage is a plurality of drive voltages,
the at one power gating transistor is a plurality of power gating transistors, and
the plurality of drive voltages are supplied such that amounts of currents flowing through the plurality of power gating transistors are controlled in accordance with the information about the activation blocks.

20. The power gating method as set forth in claim 19, wherein the semiconductor chip includes a system manager for storing the information about the activation blocks.

21. A semiconductor chip comprising:
a plurality of internal blocks;
a plurality of power gating transistors each configured to switch a supply of at least one drive voltage in a corresponding one of the plurality of internal blocks;

a system manager configured to generate control signals in accordance with activation states of the plurality of internal blocks; and a plurality of current regulators configured to operate in response to the control signals, respectively, each of the plurality of current regulators controlling an amount of current flowing through a corresponding one of the plurality of power gating transistors to be charged to a stable voltage faster during one of a wake-up and power-up period.

* * * * *